(12) United States Patent
Hara

(10) Patent No.: US 12,512,826 B2
(45) Date of Patent: Dec. 30, 2025

(54) SEMICONDUCTOR DEVICE

(71) Applicant: Rohm Co., Ltd., Kyoto (JP)

(72) Inventor: Hideo Hara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 783 days.

(21) Appl. No.: 17/792,562

(22) PCT Filed: Sep. 8, 2020

(86) PCT No.: PCT/JP2020/033847
§ 371 (c)(1),
(2) Date: Jul. 13, 2022

(87) PCT Pub. No.: WO2021/145020
PCT Pub. Date: Jul. 22, 2021

(65) Prior Publication Data
US 2023/0039616 A1    Feb. 9, 2023

(30) Foreign Application Priority Data

Jan. 14, 2020    (JP) ................................ 2020-003901

(51) Int. Cl.
*H03K 17/06*    (2006.01)
*H02M 7/5395*    (2006.01)
*H03K 3/3565*    (2006.01)

(52) U.S. Cl.
CPC ........ *H03K 17/063* (2013.01); *H02M 7/5395* (2013.01); *H03K 3/3565* (2013.01);
(Continued)

(58) Field of Classification Search
CPC ............... H03K 17/063; H03K 3/3565; H03K 2217/0063; H03K 2217/0072; H03K 2217/0081; H02M 7/5395
See application file for complete search history.

(56) References Cited

U.S. PATENT DOCUMENTS

2016/0056818 A1*   2/2016   Kanda .................. H10D 62/127
                                                             318/504
2020/0186142 A1*   6/2020   Balaz ..................... H02M 1/08

FOREIGN PATENT DOCUMENTS

JP    2018133916    8/2018

OTHER PUBLICATIONS

International Search Report in International Appln. No. PCT/JP2020/033847, dated Nov. 24, 2020, 5 pages (with English Translation).

* cited by examiner

*Primary Examiner* — Zoheb S Imtiaz
(74) *Attorney, Agent, or Firm* — Fish & Richardson P.C.

(57) ABSTRACT

A semiconductor device including: NMOS transistors respectively having the drains, which are connectable to respective second terminals of boot capacitors of which respective first terminals are connectable to respective nodes at which high-side transistors and the low-side transistors are connected together, and the sources, which are electrically connectable to an application terminal for a supply voltage; and controllers driving respective gates of the plurality of NMOS transistors. When the high-side transistor for a first channel is kept off by the driver for the first channel, the high-side transistor for a second channel, which is different from the first channel, is kept on by the driver for the second channel. The controller for the first channel feeds a drive voltage based on the boot voltage for the second channel to the gate of the NMOS transistor for the first channel to keep on the NMOS transistor.

11 Claims, 11 Drawing Sheets

(52) U.S. Cl.
CPC .............. *H03K 2217/0063* (2013.01); *H03K 2217/0072* (2013.01); *H03K 2217/0081* (2013.01)

SEMICONDUCTOR DEVICE

TECHNICAL FIELD

The present invention relates to a semiconductor device.

BACKGROUND ART

Conventionally, in a switching arm composed of a high-side transistor and a low-side transistor that are connected in series between an input voltage and a ground potential, when the high-side transistor is configured as an n-channel transistor, a bootstrap circuit is often used to drive the gate of the high-side transistor.

A conventionally common bootstrap circuit includes, for example, as disclosed in Patent Document 1, a boot capacitor and a diode. One terminal of the boot capacitor is connected to the node at which the high-side and low-side transistors in a switching arm are connected together. The other terminal of the boot capacitor is connected to the cathode of a diode. The anode of the diode is connected to an application terminal for a supply voltage. In particular, the anode is often connected to the application terminal for the supply voltage via a resistor. The other terminal of the boot capacitor is connected to a driver that drives the gate of the high-side transistor.

LIST OF CITATIONS

Patent Literature

Patent Document 1: JP-A-2018-133916

SUMMARY OF THE INVENTION

Problem to be Solved by the Invention

In the bootstrap circuit like the one mentioned above in which a diode is used, the boot capacitor is charged by the supply voltage via the diode when the low-side transistor is on (when the high-side transistor is off). A boot voltage that is generated at the cathode of the diode is fed to the gate of the high-side transistor by the driver, and the high-side transistor turns on. Here, the boot voltage equals the input voltage+(the supply voltage−Vf of the diode).

Thus, a diode loss arises due to Vf of the diode. Furthermore, the boot voltage fed to the gate declines by Vf of the diode, and thus the on-resistance of the high-side transistor increases. Inconveniently, this results in reduced efficiency.

On the other hand, recent years have seen the emergence of IPMs (intelligent power modules) that have accommodated in a single package a power device, such as an IGBT (insulated gate bipolar transistor) or a MOSFET (metal-oxide-semiconductor field-effect transistor), along with a driver IC for driving the power device. In IPMs, the power device like the one mentioned above is used as the high-side and low-side transistors that form a switching arm, and thus a high input voltage is fed to the high-side transistor.

It is preferable to improve efficiency when a boot strap circuit is applied to semiconductor devices such as IPMs that handle high voltages.

Against the background described above, the present invention is aimed at providing a high-voltage semiconductor device that can improve efficiency.

Means for Solving the Problem

According to one aspect of the present invention, a semiconductor device includes: a plurality of high-side transistors and a plurality of low-side transistors connected in series between an input voltage and a ground potential to form a plurality of switching arms; a plurality of NMOS transistors respectively having drains configured to be connectable to respective second terminals of a plurality of boot capacitors of which respective first terminals are connectable to respective nodes at which the plurality of high-side transistors and the plurality of the low-side transistors are connected together, and sources configured to be electrically connectable to an application terminal for a supply voltage; a plurality of controllers configured to drive respective gates of the plurality of NMOS transistors; and a plurality of drivers configured to feed respective boot voltages appearing at the respective second terminals or respective switching voltage appearing at the respective nodes to respective control terminals of the plurality of high-side transistors to turn on and off the high-side transistors. When the high-side transistor for a first channel is kept off by the driver for the first channel, the high-side transistor for a second channel, which is different from the first channel, is kept on by the driver for the second channel, and the controller for the first channel feeds a drive voltage based on the boot voltage for the second channel to the gate of the NMOS transistor for the first channel to keep on the NMOS transistor (a first configuration).

In the first configuration described above, preferably, the controller for the first channel is configured to turn on the NMOS transistor upon detecting that, while the low-side transistor for the first channel is off, the high-side transistor for the first channel is turned off and then the low-side transistor for the first channel is turned on (a second configuration).

In the second configuration described above, preferably, the controller for the first channel is configured to turn on the NMOS transistor upon detecting that the switching voltage for the first channel drops to a voltage lower than the ground potential and then becomes equal to the ground potential (a third configuration).

In the first configuration described above, preferably, the controller for the first channel is configured to turn on the NMOS transistor upon detecting that, while the low-side transistor for the first channel is off, the high-side transistor for the first channel is turned off (a fourth configuration).

In the fourth configuration described above, preferably, the controller for the first channel is configured to turn on the NMOS transistor upon detecting that the switching voltage for the first channel becomes lower than the ground potential (a fifth configuration).

The semiconductor device according to any of the first to fifth configurations described above, preferably, further includes a voltage adjuster configured to adjust the boot voltage for the second channel to make it a drive voltage lower than the boot voltage (a sixth configuration).

In the sixth configuration described above, preferably, the voltage adjuster includes a voltage division resistor configured to divide the boot voltage and a buffer configured to be fed with a voltage divided with the voltage division resistor to output the drive voltage (a seventh configuration).

In the sixth configuration described above, preferably, the voltage adjuster includes a constant current source configured to generate a constant current based on the boot voltage, and a Zener diode configured to be fed with a current generated by the constant current source (an eighth configuration).

In any of the first to eighth configurations described above, preferably, the plurality of high-side transistors include three high-side transistors, the plurality of low-side transistors include three low-side transistors, the plurality of switching arms include three switching arms, the plurality of boot capacitors include three boot capacitors, the plurality of NMOS transistors include three NMOS transistors, the plurality of controllers include three controllers, and the plurality of drivers include three drivers (a ninth configuration).

In the ninth configuration described above, preferably, the plurality of high-side transistors are turned on and off with a 120 degree phase difference from each other (a tenth configuration).

In the ninth or tenth configuration described above, preferably, the respective nodes are connectable to a U-phase terminal, a V-phase terminal, and a W-phase terminal of a DC brushless motor (an eleventh configuration).

In any of the first to eleventh configurations described above, preferably, the high-side and low-side transistors are turned on and off based on a driving control signal output from a microprocessor arranged outside the semiconductor device (a twelfth configuration).

Advantageous Effects of the Invention

With a semiconductor device disclosed herein, it is possible to improve efficiency in semiconductor devices that handle high input voltages.

DESCRIPTION OF EMBODIMENTS

Regarding Reference Example

Prior to a description of embodiments of the present invention, first a reference example will be described to help understand the features of embodiments of the present invention.

Figure 10:
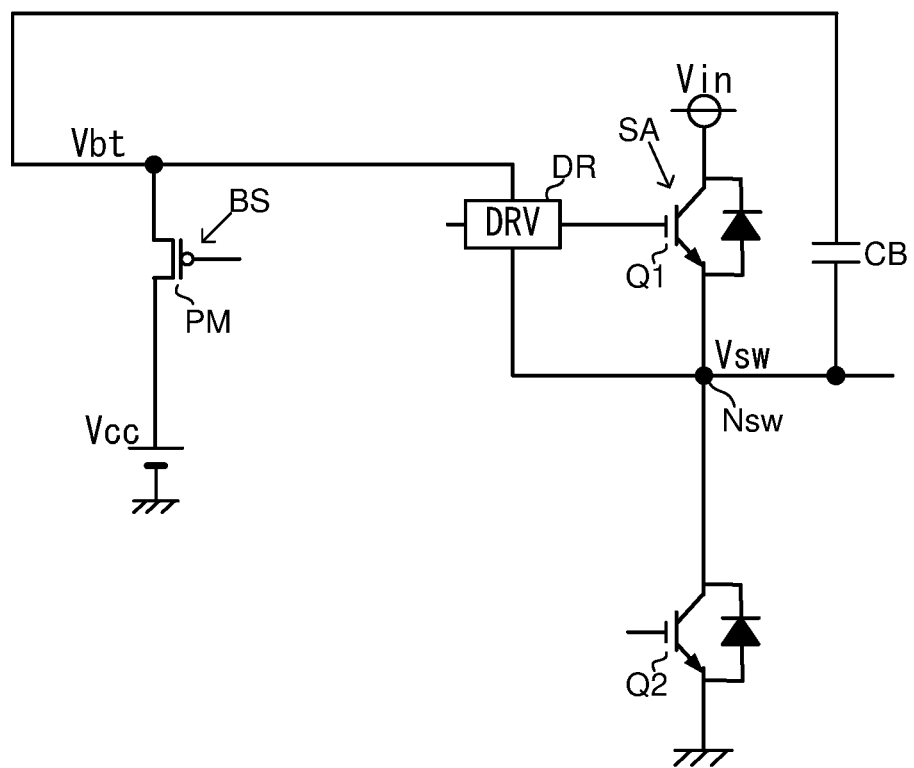
FIG. 10 is a diagram showing a configuration for driving a switching arm according to the reference example.

FIG. 10 is a diagram showing a configuration for driving a switching arm according to the reference example. A switching arm SA shown in FIG. 10 includes a high-side transistor Q1 and a low-side transistor Q2 that are connected in series between an input voltage Vin and a ground potential. In FIG. 10, the high-side and low-side transistors Q1 and Q2 are both configured as n-channel IGBTs. The gate of the high-side transistor Q1 is driven by a driver DR.

The configuration shown in FIG. 10 includes a bootstrap circuit BS. The bootstrap circuit BS includes a boot capacitor CB and a PMOS transistor PM. One terminal of the boot capacitor CB is connected to the node Nsw at which the high-side and low-side Q1 and Q2 are connected together. The other terminal of the boot capacitor CB is, along with the source of the PMOS transistor, connected to the driver DR. The drain of the PMOS transistor is connected to an application terminal for a supply voltage Vcc.

With the configuration shown in FIG. 10, when the low-side transistor Q2 is on (when the high-side transistor Q1 is off), the PMOS transistor is on. Thus, a switching voltage Vsw that appears at the node Nsw to serve as a reference potential for the boot capacitor CB equals the ground potential, and the boot capacitor CB is charged with the supply voltage Vcc via the PMOS transistor PM. Consequently, a boot voltage Vbt that appears at the other terminal of the boot capacitor CB (the source of the PMOS transistor PM) equals the supply voltage Vcc.

Thereafter, when the driver DR feeds the boot voltage Vbt to the gate of the high-side transistor Q1 and the PMOS transistor PM is turned off, the high-side transistor Q1 turns on. Now, the boot voltage Vbt equals Vin+Vcc.

With the configuration shown in FIG. 10, a PMOS transistor PM is used in the bootstrap circuit BS, and this helps suppress the voltage drop across the PMOS transistor PM compared to Vf that arises when a diode is used. The voltage drop across the PMOS transistor PM is substantially zero and this helps suppress a drop in the boot voltage Vbt that is fed to the gate of the high-side transistor Q1 thereby to reduce the on-resistance of the high-side transistor Q1. It is thus possible to improve efficiency.

However, the configuration shown in FIG. 10 is suitable for application to low-signal systems that handle low input voltages Vin. This is because the withstand voltage of the PMOS transistor PM is the sum of the withstand voltage for Vin and the withstand voltage for Vcc, and a low input voltage Vin requires a low withstand voltage in the PMOS transistor PM. PMOS transistors with low withstand voltages are available.

If, for the sake of discussion, the configuration shown in FIG. 10 is applied to an IPM or the like that handles a high input voltage Vin, a high withstand voltage is required in the PMOS transistor PM. However, high-withstand-voltage PMOS transistors PM are currently difficult to manufacture, and this makes application to IPMs and the like difficult.

Thus, in the embodiments of the present invention described later, an IPM is taken as one example of semiconductor devices that handle high input voltages Vin, and use of an NMOS transistor, which can withstand a high voltage, in the bootstrap circuit is made possible so as to improve efficiency.

<Configuration of an IPM System>

Exemplary embodiments of the present invention will be described below with reference to the accompanying drawings.

Figure 1:
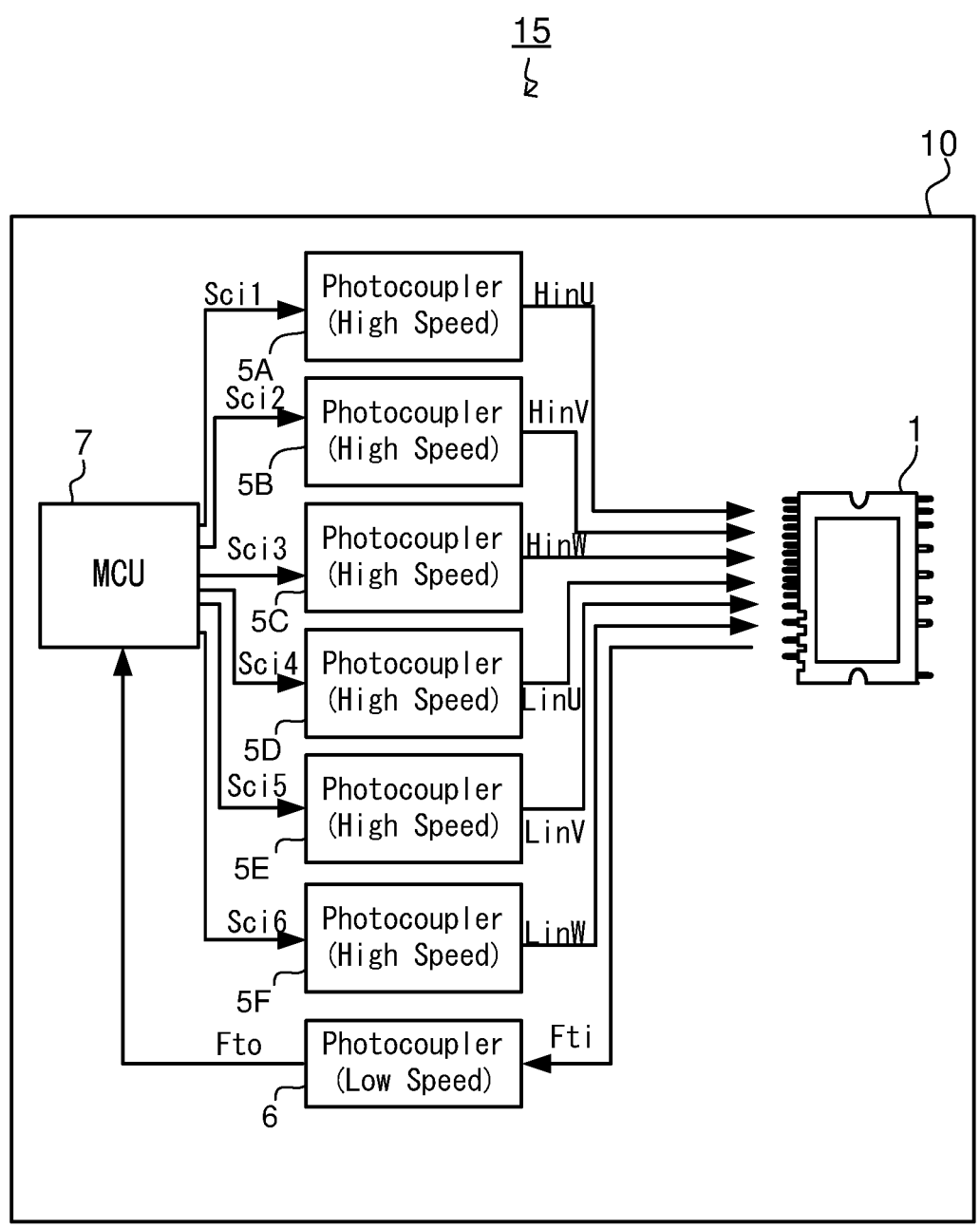
FIG. 1 is a diagram showing a configuration of an IPM system according to an exemplary embodiment of the present invention.

FIG. 1 is a diagram showing the configuration of an IPM system 15 according to an exemplary embodiment of the present invention. The IPM system 15 shown in FIG. 1 includes an MCU (microcontroller unit) 7, photocouplers 5A to 5F, a photocoupler 6, an IPM 1, and a printed circuit board (PCB) 10.

The MCU 7, the photocouplers 5A to 5F, the photocoupler 6, and the IPM 1 are mounted on the printed circuit board 10 by, for example, soldering.

The MCU 7 transmits driving control signals Sci1 to Sci6 to the photocouplers 5A to 5F respectively which have comparatively high response speeds. The photocouplers 5A to 5F transmit the driving control signals Sci6 to Sci6 fed to them, while electrically isolating them, toward the IPM 1 as driving control signals HinU, HinV, HinW, LinU, LinV and LinW.

The IPM 1 functions as a motor driver that drives a three-phase DC brushless motor (unillustrated) and has three switching arms (unillustrated) each composed of a high-side transistor and a low-side transistor connected in series. That is, the IPM 1 has six switching elements. In the IPM 1, based on the driving control signals HinU, HinV, HinW, LinU, LinV and LinW fed to it, a driver IC (unillustrated) drives the respective gates of the high-side and low-side transistors. The IPM 1 thereby operates as an inverter. The configuration of the IPM 1 will be described in detail later.

From the IPM 1, a fault signal Fti is transmitted to the photocoupler 6, which has a comparatively low response speed. The fault signal Fti is transmitted when a fault such as an undervoltage state or an overheated state occurs. The photocoupler 6 transmits the fault signal Fti fed to it, while electrically isolating it, toward the MCU 7 as a fault signal Fto. In this way, it is possible to notify the MCU 7 of a fault state.

<Configuration of the IPM>

Figure 2:
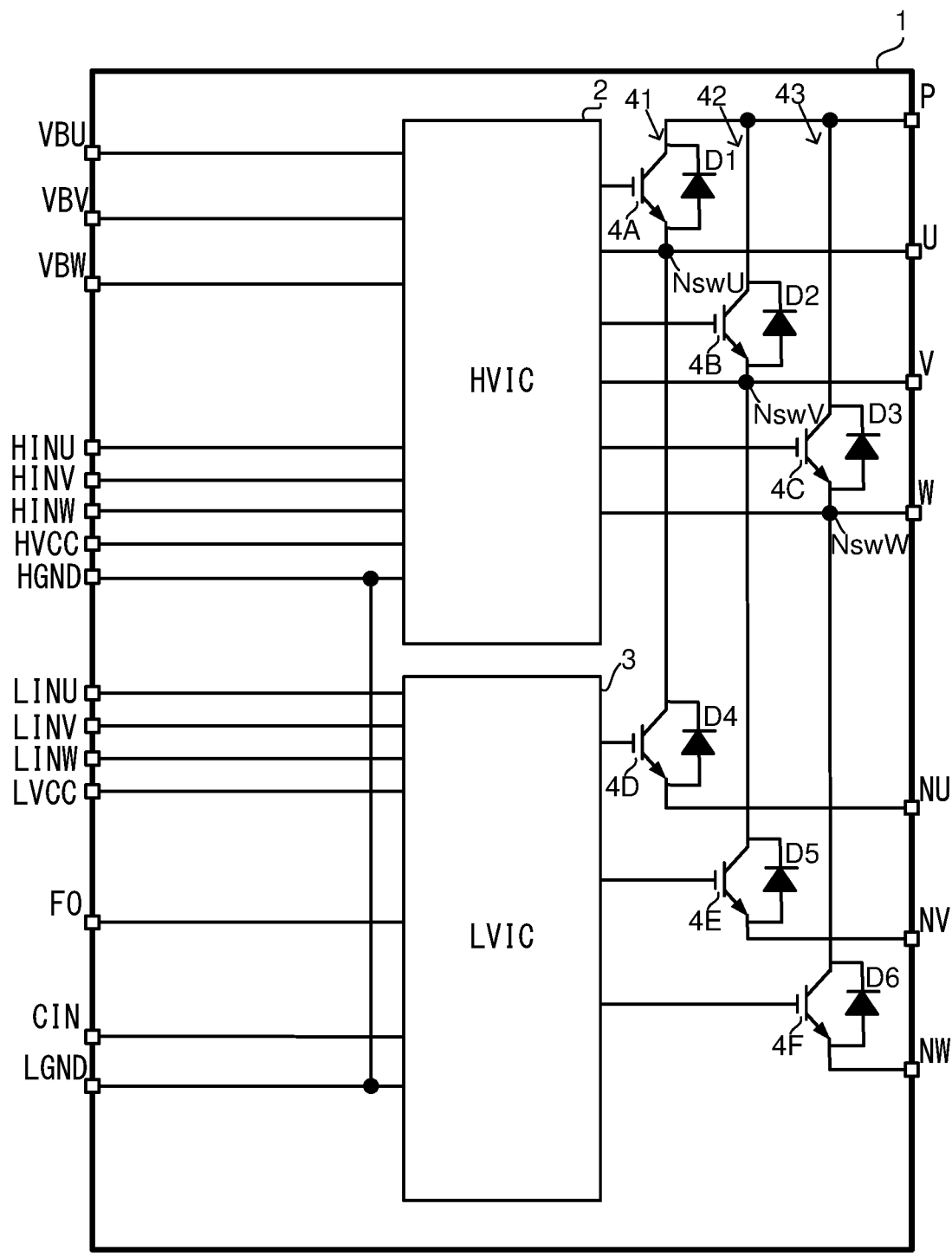
FIG. 2 is a diagram showing one example of an internal configuration of the IPM.

FIG. 2 is a diagram showing an internal configuration of the IPM 1. As shown in FIG. 2, the IPM 1 is a semiconductor device (semiconductor package) having, sealed in a sealing material such as resin forming a package, a high-side driver IC 2, a low-side driver IC 3, a first high-side transistor 4A, a second high-side transistor 4B, a third high-side transistor 4C, a first low-side transistor 4D, a second low-side transistor 4E, a third low-side transistor 4F, and antiparallel diodes D1 to D6.

The IPM 1 has external terminals (lead terminals) for establishing electrical connection with the outside, including a VBU terminal, a VBV terminal, a VBW terminal, an HINU terminal, an HINV terminal, an HINW terminal, an HVCC terminal, an HGND terminal, an LINU terminal, an LINV terminal, an LINW terminal, an LVCC terminal, an FO terminal, a CIN terminal, an LGND terminal, a P terminal, a U terminal, a V terminal, a W terminal, an NU terminal, an NV terminal, and an NW terminal.

The first high-side transistor 4A, the second high-side transistor 4B, the third high-side transistor 4C, the first low-side transistor 4D, a second low-side transistor 4E, and a third low-side transistor 4F are each configured as, for example, an IGBT using an Si (silicon) substrate. These switching elements may be configured as, instead of IGBTs, MOSFETs using Si substrates, or by IGBTs or MOSFETs using SiC substrates or semiconductor substrates of what is called a wide band gap type.

The P terminal is fed with an input voltage Vin (see FIGS. 3 and 4 referred to later) which is a high voltage. The input voltage Vin is, for example, 600 V. To the collector of the first high-side transistor 4A, the P terminal is connected. The emitter of the first high-side transistor 4A is connected to the collector of the first low-side transistor 4D. The emitter of the first low-side transistor 4D is connected to the NU terminal. In this way, the first high-side transistor 4A and the first low-side transistor 4D are connected in series to form a first switching arm 41.

To the collector of the second high-side transistor 4B, the P terminal is connected. The emitter of the second high-side transistor 4B is connected to the collector of the second low-side transistor 4E. The emitter of the second low-side transistor 4E is connected to the NV terminal. In this way, the second high-side transistor 4B and the second low-side transistor 4E are connected in series to form a second switching arm 42.

To the collector of the third high-side transistor 4C, the P terminal is connected. The emitter of the third high-side transistor 4C is connected to the collector of the third low-side transistor 4F. The emitter of the third low-side transistor 4F is connected to the NW terminal. In this way, the third high-side transistor 4C and the third low-side transistor 4F are connected in series to form a third switching arm 43.

The NU, NV, and NW terminals are connected to an application terminal for the ground potential via a common resistor Rs (see FIGS. 3 and 4 referred to later).

Thus, the IPM 1 has the switching arms 41 and 43 for three channels and is configured to have six switching elements accommodated in one package. With the first high-side transistor 4A, the antiparallel diode D1 is connected. With the second high-side transistor 4B, the antiparallel diode D2 is connected. With the third high-side transistor 4C, the antiparallel diode D3 is connected. With the first low-side transistor 4D, the antiparallel diode D4 is connected. With the second low-side transistor 4E, the antiparallel diode D5 is connected. With the third low-side transistor 4F, the antiparallel diode D6 is connected. The switching elements are configured as IGBTs, and thus the antiparallel diodes D1 to D6 are configured as externally connected elements. When the switching elements are configured as MOSFETs, the antiparallel diodes D1 to D6 are configured as parasitic diodes (body diodes) incorporated in the respective switching elements.

The U terminal is connected to the node Nsw at which the first high-side transistor 4A and the first low-side transistor 4D are connected together. The U terminal is connected to the U-phase terminal of a motor M (see FIG. 3 referred to later), which is a three-phase DC brushless motor outside the IPM 1. The V terminal is connected to the node NswV at which the second high-side transistor 4B and the second low-side transistor 4E are connected together. The V terminal is connected to the V-phase terminal of the motor M. The W terminal is connected to the node NswW at which the third high-side transistor 4C and the third low-side transistor 4F are connected together. The W terminal is connected to the W-phase terminal of the motor M.

The high-side driver IC 2 is electrically connected to the VBU, VBV, VBW, HINU, HINV, HINW, HVCC, and HGND terminals.

The VBU terminal is connected to one terminal of a first boot capacitor Cb1 (see FIGS. 3 and 4 referred to later) outside the IPM 1. The VBV terminal is connected to one terminal of a second boot capacitor Cb2 (see FIG. 4 referred to later) outside the IPM 1. The VBW terminal is connected to one terminal of a third boot capacitor Cb3 (see FIG. 4 referred to later) outside the IPM 1.

The HVCC terminal is a terminal through which the supply voltage Vcc is fed to the high-side driver IC 2. The HINU, HINV, and HINW terminals are fed, from the external MCU 7 (see FIG. 1), with the driving control signals HinU, HinV, and HinW respectively. Based on the driving control signals HinU, HinV, and HinW, the high-side driver IC 2 drives the respective gates (control terminals) of the first high-side transistor 4A, second high-side transistor 4B, and third high-side transistor 4C to turn on and off these high-side transistors.

The HGND and LGND terminals are connected together inside the IPM 1.

The low-side driver IC 3 is electrically connected to the LINU, LINV, LINW, LVCC, FO, CIN, and LGND terminals.

The LVCC terminal is a terminal through which the supply voltage Vcc is fed to the low-side driver IC 3. The LINU, LINV, and LINW terminals are fed with, from the external MCU 7 (see FIG. 1), the driving control signals LinU, LinV, and LinW respectively. Based on the driving control signals LinU, LinV, and LinW, the low-side driver IC 3 drives the respective gates of the first low-side transistor 4D, the second low-side transistor 4E, and the third low-side transistor 4F to turn on and off these low-side transistors.

The FO terminal is a terminal through which the fault signal Fti (see FIG. 1) that is output from the low-side driver IC 3 is fed toward the MCU 7. The CIN terminal is a terminal fed with a current sense signal Vis (see FIG. 3 referred to later) which is obtained by sensing a current passing through the low-side transistors 4D to 4F.

In this way, the IPM 1 has a two-chip configuration having separate IC chips for the high-side driver IC 2 that drives the three high-side transistors and the low-side driver IC 3 that drives the three low-side transistors. The high-side driver IC 2 is formed by, for example, an SOI (silicon-on-insulator) so as to withstand a high voltage.

Figure 3:
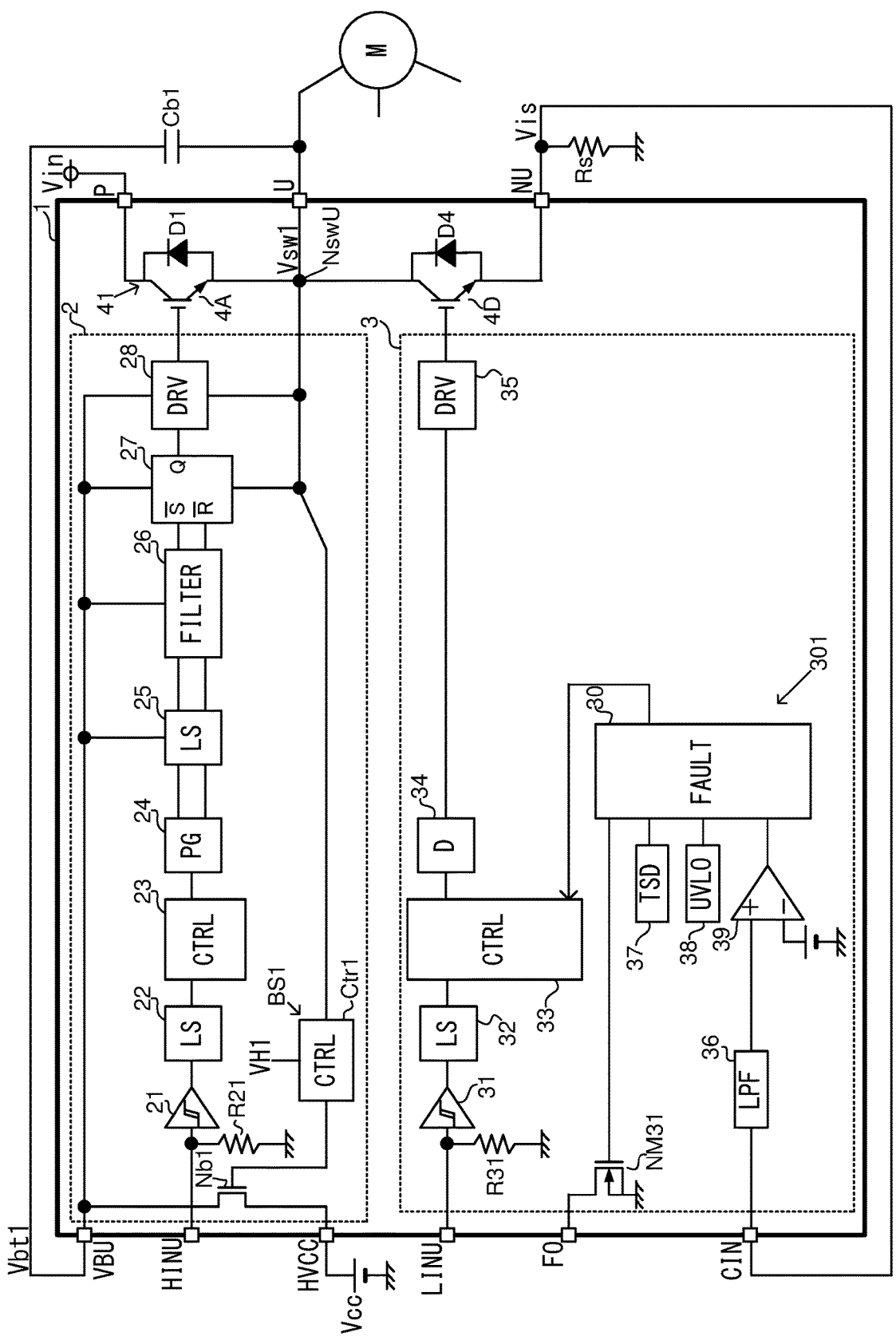
FIG. 3 is a diagram showing one example of the internal configuration of a high-side driver IC and a low-side driver IC.

FIG. 3 is a diagram showing one example of a circuit configuration for driving the switching arm 41 (the first high-side transistor 4A and the first low-side transistor 4D) in the high-side driver IC 2 and the low-side driver IC 3. The following description deals with the configuration for U-phase as a representative out of the three phases of the motor M.

As shown in FIG. 3, the high-side driver IC 2 includes, in order from the input side (HINU terminal side) toward the output side (U terminal side), a resistor R21, a Schmitt trigger 21, a level shifter 22, a controller 23, a pulse generator 24, a level shifter 25, a filter 26, an RS flip-flop 27, and a driver 28.

The resistor R21 pulls down the HINU terminal to the application terminal for the ground potential. Thus, when the HINU terminal is open, the driving control signal HinU that is fed from the MCU 7 to the HINU terminal is at low level (the logic level that keeps off the first high-side transistor 4A), and this prevents the first high-side transistor 4A from being turned on unintendedly.

The Schmitt trigger 21 transmits the driving control signal HinU that is fed to the HINU terminal to the level shifter 22. The threshold voltage of the Schmitt trigger 21 is given prescribed hysteresis. With this configuration, it is possible to improve resistance to noise.

The level shifter 22 shifts the level of the output signal of the Schmitt trigger 21 to a voltage level that is suitable for input to the controller 23, and outputs the result. The controller 23 transmits the output signal of the level shifter 22 to the pulse generator 24.

Based on the output signal of the controller 23, the pulse generator 24 generates pulse signals as an on-signal Son and an off-signal Soff. More specifically, the pulse generator 24 is triggered by a rising edge in the output signal of the controller 23 to keep the on-signal Son at high level for a predetermined on-period Ton1, and is triggered by a falling edge in the output signal of the controller 23 to keep the off-signal Soff at high level for a predetermined on-period Ton2. The on-periods Ton1 and Ton2 are determined such that the on-signal Son and the off-signal Soff are not at high level at the same time. That is, while the IPM 1 is operating normally, when one of the on-signal Son and the off-signal Soff is at high level, the other is at low level.

The level shifter 25 is a circuit which, between a high-potential block including the filter 26, the RS flip-flop 27, and the driver 28 and a low-potential block including the pulse generator 24, shifts the levels of signals to transmit them from the low-potential block to the high-potential block. More specifically, the level shifter 25 is fed with, from the pulse generator 24 in the low-potential block, the pulse signals as the on-signal Son and the off-signal Soff. The level shifter 25 shifts the level of these signals to feed them to the filter 26 as a first shifted signal and a second shifted signal. The high-potential block operates between the first boot voltage Vbt1 that is fed to the VBU terminal and a first switching voltage Vsw1 that is fed to the U terminal.

The filter 26 is a circuit which filters the first and second shifted signals that are fed from the level shifter 25 to feed the results to the RS flip-flop 27.

The RS flip-flop 27 has a set terminal (S terminal) to which the first shifted signal that has been filtered by the filter 26 is fed as a set signal S set, a reset terminal (R terminal) to which the second shifted signal that has been filtered by the filter 26 is fed as a reset signal Sreset, and an output terminal (Q terminal) from which an output signal Sq is output. The RS flip-flop is triggered by a falling edge in the set signal Sset to set the output signal Sq to high level, and is triggered by a falling edge in the reset signal Sreset to set the output signal Sq to low level.

The driver 28 generates a high-side output signal HOU, which is a signal in accordance with the output signal of the RS flip-flop 27, and feeds it to the gate of the first high-side transistor 4A. The high level of the high-side output signal HOU equals the first boot voltage Vbt1, and the low level of the same signal equals the first switching voltage Vsw1. That is, the driver 28 feeds the first boot voltage Vbt1 or the first switching voltage Vsw1 to the gate (control terminal) of the first high-side transistor 4A to turn on and off the first high-side transistor 4A.

The high-side driver IC 2 includes a first NMOS transistor Nb1 and a first controller Ctrl. A first bootstrap circuit BS1 includes the first NMOS transistor Nb1, the first controller Ctrl1, and a first boot capacitor Cb1 arranged outside the IPM 1. The source of the first NMOS transistor Nb1 is connected to the HVCC terminal. The drain of the first NMOS transistor Nb1 is connected to the VBU terminal. One terminal of the first boot capacitor Cb1 is connected to the VBU terminal. The other terminal of the first boot capacitor Cb1 is connected to the U terminal. The first controller Ctrl drives the gate of the first NMOS transistor Nb1 to turn on and off the first NMOS transistor Nb1. The first controller Ctrl is also connected to the node NswU so as to be able to monitor the first switching voltage Vsw1.

A description will be given later of a method for generating a first drive voltage VH1 which is a high-level voltage to be fed to the gate of the first NMOS transistor Nb1 so that the first controller Ctrl turns on the first NMOS transistor Nb1.

Thus, the first bootstrap circuit BS1 is provided to correspond to the first switching arm 41 for U phase to generate at the VBU terminal the first boot voltage Vbt1 (a drive voltage for the high-potential block including the driver 28 etc.).

Circuit configurations for driving the second high-side transistor 4B (V phase) and the third high-side transistor 4C (W phase) respectively are, like the configuration between the resistor R21 and the driver 28 described above, formed in the high-side driver IC 2. In addition, corresponding to the second switching arm 42 for V phase and the third switching arm 43 for W phase, a second bootstrap circuit BS2 and a third bootstrap circuit BS3 (FIG. 4 referred to later) are formed respectively.

The low-side driver IC 3 includes, in order from the input side (LINU terminal side) toward the output side (U terminal side), a resistor R31, a Schmitt trigger 31, a level shifter 32, a controller 33, a delay circuit 34, and a driver 35.

The resistor R31 pulls down the LINU terminal to the application terminal for the ground potential. Thus, when the LINU terminal is open, the driving control signal LinU that is fed from the MCU 7 is at low level (the logic level that keeps off the first low-side transistor 4D), and this prevents the first low-side transistor 4D from being turned on unintendedly.

The Schmitt trigger 31 transmits the driving control signal LinU that is fed to the LINU terminal to the level shifter 32. The threshold voltage of the Schmitt trigger 31 is given prescribed hysteresis. With this configuration, it is possible to improve resistance to noise.

The level shifter 32 shifts the level of the output signal of the Schmitt trigger 31 to a voltage level that is suitable for input to the controller 33, and outputs the result.

Based on a fault signal that is fed from a fault protector 301, the controller 34 controls whether or not to transmit the output signal of the level shifter 32 to the delay circuit 34 (and hence whether or not to drive the first low-side transistor 4D).

The delay circuit 34 gives the output signal from the controller 33 a predetermined delay (corresponding to the circuit delay in the pulse generator 24, the level shifter 25, the filter 26, and the RS flip-flop 27 in the high-side driver IC 2) and transmits the result to the driver 35.

The driver 35, based on the output signal from the controller 33 which is delayed by the delay circuit 34, outputs the low-side output signal LOU to the gate of the first low-side transistor 4D. The high level of the low-side output signal LOU equals the supply voltage Vcc, and the low level of the same signal equals the ground potential.

The fault protector 301 includes a fault signal generation circuit 30, a low-pass filter 36, a temperature protection circuit (TSD [thermal shutdown] circuit 37, an undervoltage-lockout circuit (ULVO circuit) 38, and an overcurrent protection circuit 39.

The TSD circuit 37, when the junction temperature of the IPM (semiconductor device) 1 becomes higher than a predetermined threshold value, switches the logic level of a temperature protection signal from one indicating a normal state (for example, low level) to one indicating a fault (for example, high level).

The UVLO circuit 38, when the supply voltage Vcc becomes lower than a predetermined threshold value, switches the logic level of a malfunction protection signal from one indicating a normal state (for example, low level) to one indicating a fault (for example, high level).

The CIN terminal is connected to the node at which the NU terminal and one terminal of the resistor Rs are connected together. A low-pass filter 36 is electrically connected to the CIN terminal. The low-pass filter 36 feeds the current sense signal Vis that appears at the CIN terminal to the overcurrent protection circuit 39. The overcurrent protection circuit 39 is configured with a comparator, and the non-inverting input terminal (+) of the comparator is fed with the output of the low-pass filter 36, and the inverting terminal (−) of the comparator is fed with a reference voltage. The overcurrent protection circuit 39, when the current sense signal Vis becomes higher than a predetermined threshold value, switches the logic level of an overcurrent protection signal from one indicating a normal state (for example, low level) to one indicating a fault (for example, high level).

The fault signal generation circuit 30 monitors the temperature protection signal fed from the TSD circuit 37, the malfunction protection signal fed from the UVLO circuit 38, and the overcurrent protection signal fed from the overcurrent protection circuit 39. The fault signal generation circuit 30, when at least one of the temperature protection signal, the malfunction protection signal, and the overcurrent protection signal indicates a fault, switches the logic level of the fault signal from one indicating a normal state (for example, low level) to one indicating a fault (for example, high level). The fault signal generation circuit 30 feeds a fault signal to the controller 33.

The controller 33, when fed with a fault signal indicating a fault, turns off the first low-side transistor 4D. An NMOS transistor NM31 forms an open-drain output stage for outputting the fault signal Fti from the FO terminal. When there is no fault, the NMOS transistor NM31 is kept off by the fault signal generation circuit 30, and the fault signal Fti is kept at high level. On the other hand, when there is a fault, the NMOS transistor NM31 is kept on by the fault signal generation circuit 30, and the fault signal Fti is kept at low level.

Circuit configurations for driving the second low-side transistor 4E (V phase) and the third low-side transistor 4F (W phase) respectively are, like the configuration between the resistor R31 and the driver 35 described above, formed in the low-side driver IC 3.

<Configuration of the Bootstrap Circuit>

Next, the configuration of the bootstrap circuit in the IPM 1 will be described in more detail. FIG. 4 is a diagram showing the configuration of a principal portion of the bootstrap circuit in the IPM 1.

Figure 4:
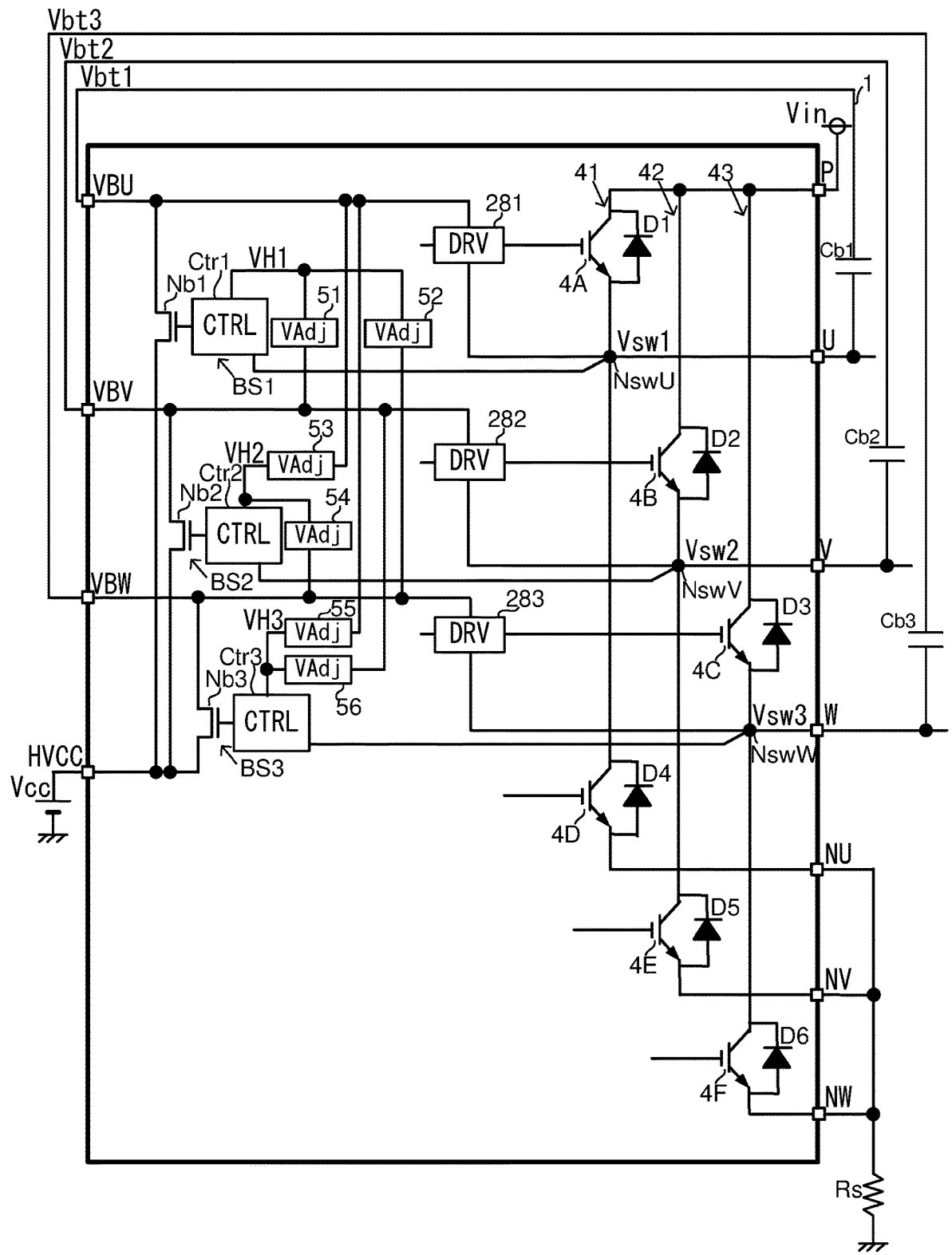
FIG. 4 is a diagram showing the configuration of a principal portion of a bootstrap circuit in the IPM.

As shown in FIG. 4, the IPM 1 includes, corresponding to the switching arms 41 to 43 for the three channels, the bootstrap circuits BS1 to BS3 for the three channels.

As described in connection with FIG. 3 referred to previously, the first bootstrap circuit BS1 includes the first NMOS transistor Nb1, the first controller Ctr1, and the first boot capacitor Cb1. The source of the first NMOS transistor Nb1 is connected to the HVCC terminal so as to be fed with the supply voltage Vcc. The drain of the first NMOS transistor Nb1 is connected to the VBU terminal. One terminal of the first boot capacitor Cb1, outside the IPM 1, is connected to the VBU terminal. The other terminal of the first boot capacitor Cb1 is connected to the U terminal.

A first driver 281 in FIG. 4 corresponds to the driver 28 in FIG. 3 referred to previously and drives the gate of the first high-side transistor 4A. The first driver 281 is fed with the first boot voltage Vbt1 that appears at the VBU terminal. Thus the first driver 281 feeds the first boot voltage Vbt1 to the gate of the first high-side transistor 4A and thereby turns on the first high-side transistor 4A.

The second bootstrap circuit BS2 includes a second NMOS transistor Nb2, a second controller Ctr2, and the second boot capacitor Cb2. The source of the second NMOS transistor Nb2 is connected to the HVCC terminal so as to be fed with the supply voltage Vcc. The drain of the second NMOS transistor Nb2 is connected to the VBV terminal. One terminal of the second boot capacitor Cb2, outside the IPM 1, is connected to the VBV terminal. The other terminal of the second boot capacitor Cb2 is connected to the V terminal.

A second driver 282 drives the gate of the second high-side transistor 4B. The second driver 282 is fed with a second boot voltage Vbt2 that appears at the VBV terminal. Thus the second driver 282 feeds the second boot voltage Vbt2 to the gate of the second high-side transistor 4B and thereby turns on the second high-side transistor 4B.

The third bootstrap circuit BS3 includes a third NMOS transistor Nb3, a third controller Ctr3, and the third boot capacitor Cb3. The source of the third NMOS transistor Nb3 is connected to the HVCC terminal so as to be fed with the supply voltage Vcc. The drain of the third NMOS transistor Nb3 is connected to the VBW terminal. One terminal of the third boot capacitor Cb3, outside the IPM 1, is connected to the VBW terminal. The other terminal of the third boot capacitor Cb3 is connected to the W terminal.

A third driver 283 drives the gate of the third high-side transistor 4C. The third driver 283 is fed with a third boot voltage Vbt3 that appears at the VBW terminal. Thus the third driver 283 feeds the third boot voltage Vbt3 to the gate of the third high-side transistor 4C and thereby turns on the third high-side transistor 4C.

A first voltage adjuster 51 adjusts the second boot voltage Vbt2 that appears at the VBV terminal to make it a predetermined first drive voltage VH1 that is lower than the second boot voltage Vbt2 and outputs the result to the first controller Ctr1. A second voltage adjuster 52 adjusts the third boot voltage Vbt3 that appears at the VBW terminal to make it a predetermined first drive voltage VH1 that is lower than the third boot voltage Vbt3 and outputs the result to the first controller Ctr1. The first controller Ctr1 feeds the first drive voltage VH1 to the gate of the first NMOS transistor Nb1 and thereby turns on the first NMOS transistor Nb1.

A third voltage adjuster 53 adjusts the first boot voltage Vbt1 that appears at the VBU terminal to make it a predetermined second drive voltage VH2 that is lower than the first boot voltage Vbt1 and outputs the result to the second controller Ctr2. A fourth voltage adjuster 54 adjusts the third boot voltage Vbt3 that appears at the VBW terminal to make it a predetermined second drive voltage VH2 that is lower than the third boot voltage Vbt3 and outputs the result to the second controller Ctr2. The second controller Ctr2 feeds the second drive voltage VH2 to the gate of the second NMOS transistor Nb2 and thereby turns on the second NMOS transistor Nb2.

A fifth voltage adjuster 55 adjusts the first boot voltage Vbt1 that appears at the VBU terminal to make it a predetermined third drive voltage VH3 that is lower than the first boot voltage Vbt1 and outputs the result to the third controller Ctr3. A sixth voltage adjuster 56 adjusts the second boot voltage Vbt2 that appears at the VBV terminal to make it a predetermined third drive voltage VH3 that is lower than the second boot voltage Vbt2 and outputs the result to the third controller Ctr3. The third controller Ctr3 feeds the third drive voltage VH3 to the gate of the third NMOS transistor Nb3 and thereby turns on the third NMOS transistor Nb3.

<Operation of the Bootstrap Circuit>

Figure 5:
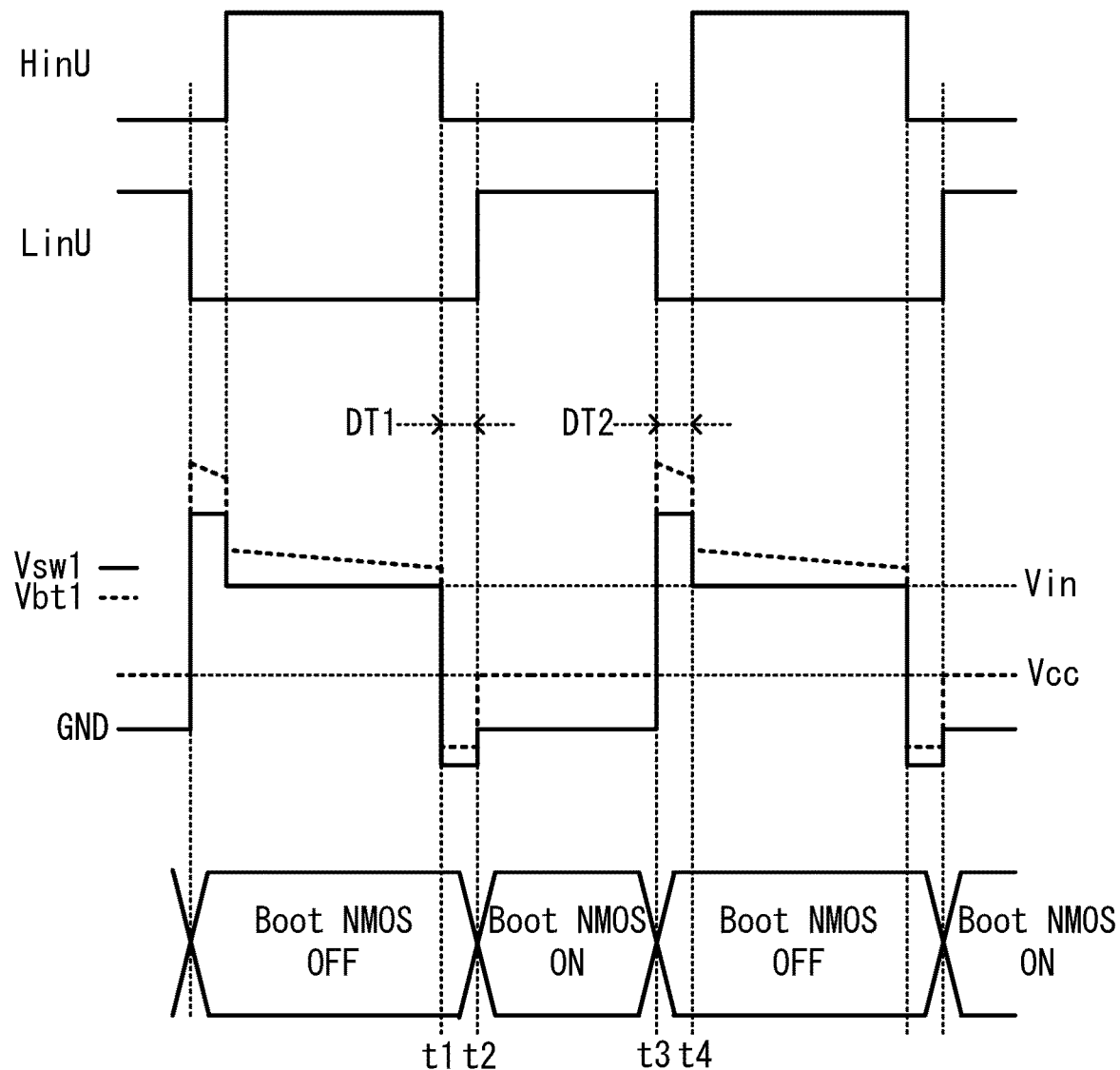
FIG. 5 is a timing chart showing an example of an operation of a first bootstrap circuit.

Next, the operation of the bootstrap circuit so configured will be described. FIG. 5 is a timing chart showing an example of the operation of the first bootstrap circuit BS1. FIG. 5 shows, from top down, the driving control signals HinU and LinU, the first switching voltage Vsw1 (solid line), the first boot voltage Vbt1 (broken line), and the on/off state of the first NMOS transistor Nb1. FIG. 5 is a diagram showing a first method of turning on and off the first NMOS transistor Nb1.

As shown in FIG. 5, to prevent the first high-side transistor 4A and the first low-side transistor 4D from being on simultaneously, according to the driving control signals HinU and LinU that are output from the MCU 7 (see FIG. 1), simultaneously-off periods (dead times) DT1 and DT2 are provided in which the first high-side transistor 4A and the first low-side transistor 4D are both off.

Before time point t1 in FIG. 5, the driving control signal HinU is at high level and thus the first high-side transistor 4A is on; the driving control signal LinU is at low level and thus the first low-side transistor 4D is off. In this state, the first NMOS transistor Nb1 is off. When, at time point t1, the driving control signal HinU turns from high level to low level, the first driver 281 turns off the first high-side transistor 4A. The dead time DT1 is thus started.

Then, the current that, with the first high-side transistor 4A on, has been passing from the input voltage Vin via the first high-side transistor 4A and the U terminal to the inductor inside the motor M tends to keep passing, by the action of the inductor, from the NU terminal via the antiparallel diode D4 connected to the first low-side transistor 4D to the U terminal. Thus, the first switching voltage Vsw1 that appears at the node NswU is lower than the ground potential by Vf across the antiparallel diode D4. The first controller Ctr1 monitors the first switching voltage Vsw1 to sense that the first switching voltage Vsw1 has become lower than the ground potential, and keeps off the first NMOS transistor Nb1. As a result, the first boot voltage Vbt1 can become, as shown in FIG. 4, lower than the ground potential.

Thereafter, when, at time point t2, the driving control signal LinU is turned from low level to high level, the first low-side transistor 4D is turned on. As a result, the first switching voltage Vsw1 becomes equal to the ground potential. Here, when the first controller Ctr1 senses that the first switching voltage Vsw1 has become equal to the ground potential, it turns on the first NMOS transistor Nb1.

Figure 6:
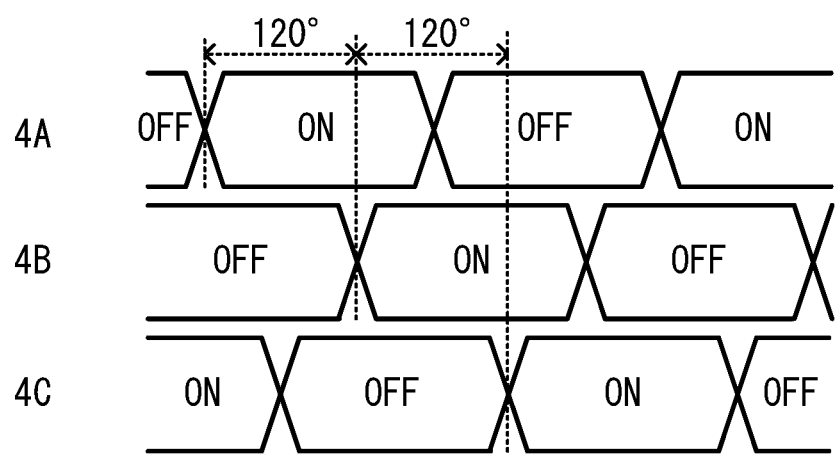
FIG. 6 is a diagram showing one example of a transition of on/off states of a first high-side transistor, a second high-side transistor, and a third high-side transistor.

FIG. 6 is a diagram showing one example of the transition of the on/off states of the first high-side transistor 4A, the second high-side transistor 4B, and the third high-side transistor 4C. The first high-side transistor 4A, the second high-side transistor 4B, and the third high-side transistor 4C are turned on and off with the driving control signals HinU, HinV, and HinW that are output from the MCU 7 (see FIG. 1).

In the example shown in FIG. 6, the first high-side transistor 4A, the second high-side transistor 4B, and the third high-side transistor 4C are turned on and off with a 120 degree phase difference from each other. Thus, when the first high-side transistor 4A is off, at least one of the second high-side transistor 4B and the third high-side transistor 4C is on.

When the second high-side transistor 4B is on, the second boot capacitor Cb2 is charged with the supply voltage Vcc via the second NMOS transistor Nb2, so that the second boot voltage Vbt2 equals Vin+Vcc. When the third high-side transistor 4C is on, the third boot capacitor Cb3 is charged with the supply voltage Vcc via the third NMOS transistor Nb3, so that the third boot voltage Vbt3 equals Vin+Vcc.

Then, the second and third boot voltages Vbt2 and Vbt3 are adjusted by the first and second voltage adjusters 51 and 52 respectively to be equal to the first drive voltages VH1, and are fed to the first controller Ctr1. Thus, the first controller Ctr1 can feed the first drive voltage VH1, which is higher than the supply voltage Vcc fed to the source of the first NMOS transistor Nb1, to the gate of the first NMOS transistor Nb1, and can thus turn on the first NMOS transistor Nb1.

Thus, the first boot capacitor Cb1 is charged with the supply voltage Vcc via the first NMOS transistor Nb1 that is on, and the first boot voltage Vbt1 equals the supply voltage Vcc (see FIG. 5).

Thereafter, when, at time point t3, the driving control signal LinU is turned from high level to low level, the first low-side transistor 4D is turned off. The dead time DT2 is thus started. Then, the current that, with the first low-side transistor 4D on, has been passing from the U terminal via the first low-side transistor 4D to the ground tends to keep passing, by the action of the inductor, from the U terminal via the antiparallel diode D1 connected to the first high-side transistor 4A to the P terminal. As a result, the first switching voltage Vsw1 is higher than the input voltage Vin by Vf across the antiparallel diode D1. Here, the first boot voltage Vbt1 is higher than the first switching voltage Vsw1 by Vcc.

When the first controller Ctr1 senses that the first switching voltage Vsw1 has become higher than the input voltage Vin, it turns off the first NMOS transistor Nb1. Then, the first boot capacitor Cb1 is discharged by an internal circuit, so that the first boot voltage Vbt1 decreases gradually.

When, at time point t4, the driving control signal HinU turns from low level to high level, the first driver 281 feeds the first boot voltage Vbt1 to the gate of the first high-side transistor 4A. Here, the first boot voltage Vbt1 approximately equals Vin+Vcc, and thus it can turn on the first high-side transistor 4A. Thereafter, the first boot capacitor Cb1 is discharged by an internal circuit, so that the first boot voltage Vbt1 decreases gradually.

The operation of the second bootstrap circuit BS2 is similar to that shown in FIG. 5. That is, the waveforms of the driving control signals HinV and LinV, the second switching voltage Vsw2 that appears at the node NswV, and the second boot voltage Vbt2 as well as the on/off state of the second NMOS transistor Nb2 are similar to those shown in FIG. 5.

Thus, when the driving control signal LinV is turned from low level to high level and thereby the second low-side transistor 4E is turned on (corresponding to time point t2 in FIG. 5), the second controller Ctr2 monitors the second switching voltage Vsw2 to sense that the second switching voltage Vsw2 has become equal to the ground potential and thereby turns on the second NMOS transistor Nb2.

Here, as shown in FIG. 6, when the second high-side transistor 4B is off, at least one of the first high-side transistor 4A and the third high-side transistor 4C is on.

When the first high-side transistor 4A is on, the first boot capacitor Cb1 is charged with the supply voltage Vcc via the first NMOS transistor Nb1, so that the first boot voltage Vbt1 equals Vin+Vcc. When the third high-side transistor 4C is on, the third boot capacitor Cb3 is charged with the supply voltage Vcc via the third NMOS transistor Nb3, so that the third boot voltage Vbt3 equals Vin+Vcc.

Then, the first and third boot voltages Vbt1 and Vbt3 are adjusted by the third and fourth voltage adjusters 53 and 54 respectively to be equal to the second drive voltages VH2, and are fed to the second controller Ctr2. Thus, the second controller Ctr2 can feed the second drive voltage VH2, which is higher than the supply voltage Vcc fed to the source of the second NMOS transistor Nb2, to the gate of the second NMOS transistor Nb2, and can thus turn on the second NMOS transistor Nb2.

Thus, the second boot capacitor Cb2 is charged with the supply voltage Vcc via the second NMOS transistor Nb2 that is on, and the second boot voltage Vbt2 equals the supply voltage Vcc.

The operation of the third bootstrap circuit BS3 is similar to that shown in FIG. 5. That is, the waveforms of the driving control signals HinW and LinW, the third switching voltage Vsw3 that appears at the node NswW, and the third boot voltage Vbt3 as well as the on/off state of the third NMOS transistor Nb3 are similar to those shown in FIG. 5.

Thus, when the driving control signal LinW is turned from low level to high level and thereby the third low-side transistor 4F is turned on (corresponding to time point t2 in FIG. 5), the third controller Ctr3 monitors the third switching voltage Vsw3 to sense that the third switching voltage Vsw3 has become equal to the ground potential and thereby turns on the third NMOS transistor Nb3.

Here, as shown in FIG. 6, when the third high-side transistor 4C is off, at least one of the first high-side transistor 4A and the second high-side transistor 4B is on.

When the first high-side transistor 4A is on, the first boot capacitor Cb1 is charged with the supply voltage Vcc via the first NMOS transistor Nb1, so that the first boot voltage Vbt1 equals Vin+Vcc. When the second high-side transistor 4B is on, the second boot capacitor Cb2 is charged with the supply voltage Vcc via the second NMOS transistor Nb2, so that the second boot voltage Vbt2 equals Vin+Vcc.

The first and second boot voltages Vbt1 and Vbt2 are adjusted by the fifth and sixth voltage adjusters 55 and 56 respectively to be equal to the third drive voltages VH3, and are fed to the third controller Ctr3. Thus, the third controller Ctr3 can feed the third drive voltage VH3, which is higher than the supply voltage Vcc fed to the source of the third NMOS transistor Nb3, to the gate of the third NMOS transistor Nb3, and can thus turn on the third NMOS transistor Nb3.

Thus, the third boot capacitor Cb3 is charged with the supply voltage Vcc via the third NMOS transistor Nb3 that is on, and the third boot voltage Vbt3 equals the supply voltage Vcc.

In this embodiment, in the IPM 1 that handles a high input voltage Vin, the withstand voltage of the first NMOS transistor Nb1, the second NMOS transistor Nb2, and the third NMOS transistor Nb3 equals the withstand voltage for Vin+the withstand voltage for Vcc. Since the input voltage Vin is a high voltage, a high withstand voltage is required in the NMOS transistors, and NMOS transistors can handle high voltages.

As described earlier, when, out of the boot capacitors Cb1 to Cb3, the one for a channel to be charged is charged, the boot voltage for another channel that has the high-side transistor on can be used to keep on the NMOS transistors Nb1 to Nb3 for the channel to be charged. This helps suppress the voltage drop across the NMOS transistors Nb1 to Nb3 that are on compared to Vf that arises when a diode is used, so that the boot voltages Vbt to Vbt3 to be applied to the gates of the high-side transistors 4A to 4C approximately equal Vin+Vcc, and this helps reduce the on-resistances of the high-side transistors 4A to 4C and improve efficiency.

<Second Method of Turning on and Off the NMOS Transistor>

Figure 7:
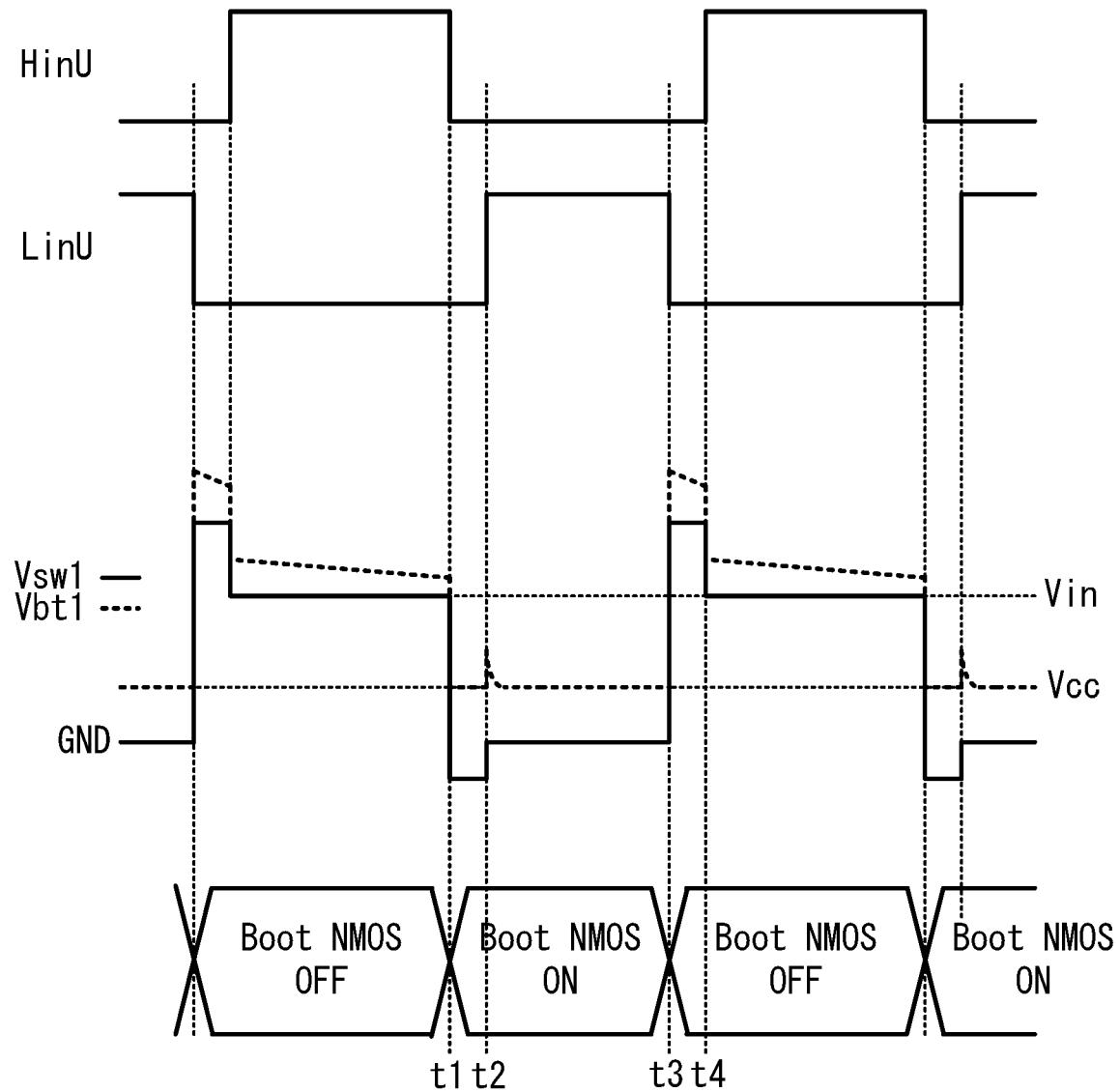
FIG. 7 is a timing chart showing another example of the operation of the first bootstrap circuit.

FIG. 7 is a timing chart showing a second method of turning on and off the first NMOS transistor Nb1 in the first bootstrap circuit BS1. FIG. 7 is a diagram corresponding to FIG. 5 referred to previously. The second method is applied also to the second and third NMOS transistors Nb2 and Nb3.

A difference of the second method shown in FIG. 7 from the first method shown in FIG. 5 is that it turns on the first NMOS transistor Nb1 at time point t1 at which the first controller Ctr1 senses that the first switching voltage Vsw1 becomes lower than the ground potential.

Thus, charging proceeds with the first NMOS transistor Nb1 fed with the supply voltage Vcc having added to it the first switching voltage Vsw1, which is lower than the ground potential. Accordingly, when, at time point t2 shown in FIG. 7, the first switching voltage Vsw1 becomes equal to the ground potential, the first boot voltage Vbt1 rises up to a voltage higher than Vcc, but the first boot capacitor Cb1 is discharged by the first NMOS transistor Nb1 that is on, and thus the first boot voltage Vbt1 falls to Vcc. That is, the first boot capacitor Cb1 is overcharged momentarily but recovers by discharging.

In the first method of turning on and off the first NMOS transistor Nb1 described earlier (FIG. 5), the first NMOS transistor Nb1 is kept off at time point t1, and this helps suppress the first NMOS transistor Nb1 from being overcharged at time point t2.

The first and second methods described above can both prevent a high boot voltage due to overcharging from being fed to the gate of the high-side transistor, and this is particularly effective in applications that use transistors (for example, transistors using SiC) having a small margin for the typical gate voltage with respect to the maximum rated gate voltage.

<Configuration of the Voltage Adjuster>

Figure 8:
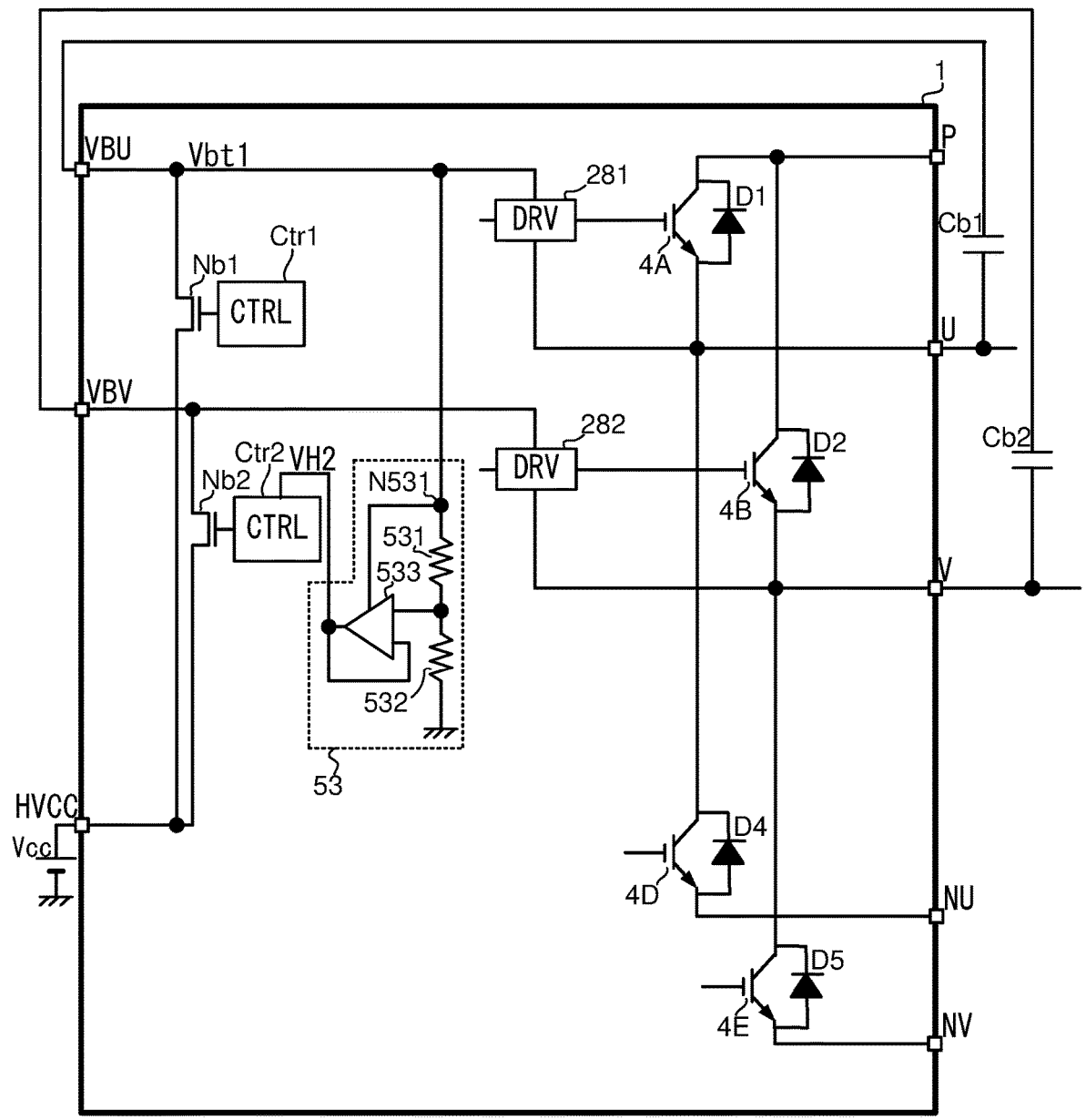
FIG. 8 is a diagram showing one configuration example of a voltage adjuster.

FIG. 8 is a diagram showing one specific configuration example of the voltage adjuster 53. Although the following description deals with the configuration of the voltage adjuster 53 as a representative out of the voltage adjusters 51 to 56, the other voltage adjusters can be similarly configured.

The voltage adjuster 53 shown in FIG. 8 includes a voltage division resistor 531, a voltage division resistor 532, and a buffer (voltage follower) 533. The first boot voltage Vbt1 that appears at the VBU terminal is divided with the voltage division resistors 531 and 532 and is then fed to the buffer 533. The buffer 533, based on the divided voltage fed to it, feeds the second drive voltage VH2 to the second controller Ctr2.

In a configuration where the first boot voltage Vbt1 is divided with the voltage division resistors 531 and 532, providing the buffer 533 forms a path for the current that passes from the node N531 at which the voltage division resistor 531 and the VBU terminal are connected together to the buffer 533; this helps stabilize the current that passes across the voltage division resistors 531 and 532 and thereby stabilize the divided voltage.

Figure 9:
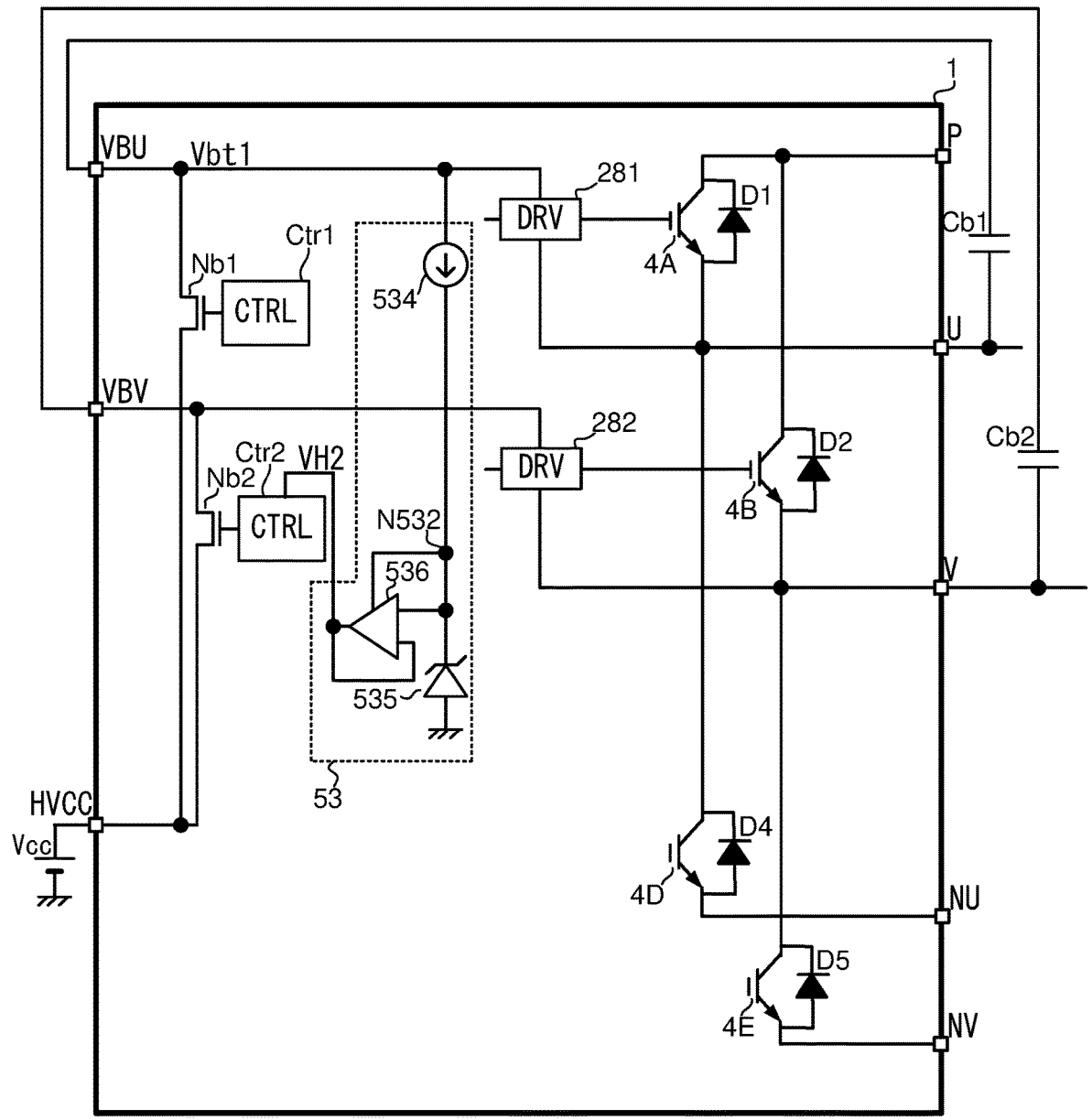
FIG. 9 is a diagram showing another configuration example of the voltage adjuster.

FIG. 9 is a diagram showing another configuration example of the voltage adjuster 53. The voltage adjuster 53 shown in FIG. 9 includes a constant current circuit 534, a Zener diode 535, and a buffer 536.

The constant current circuit 534 generates a constant current based on the first boot voltage Vbt1 that appears at the VBU terminal. The generated constant current is passed across the Zener diode 535. The voltage clamped by the Zener diode 535 is fed to the buffer 536. The buffer 536, based on the voltage that is fed to it, feeds the second drive voltage VH2 to the second controller Ctr2.

In this configuration example, the Zener diode 535 is used, and thus it is possible to stabilize the clamp voltage even when, as shown in FIG. 9, no current path is provided which leads to the buffer 536 from the node N532 at which the cathode of the Zener diode 535 and the constant current circuit 534 are connected together and the current that passes through the Zener diode 535 changes. That is, the buffer 536 may or may not be provided.

<Others>

The above embodiments should be understood to be in every aspect illustrative and not restrictive. The technical scope of the present invention is defined not by the description of the embodiments given above but by the appended claims, and should be understood to encompass any modifications made in the sense and scope equivalent to those of the claims.

For example, although the IPM described above is configured to include switching arms and bootstrap circuits for three channels, this is not meant as any limitation; it may include any number, two or more, of channels. For example, the IPM may be configured to have two channels so as to be applied to an inverter that generates a two-phase AC current, a full-bridge DC-DC converter, or the like.

Figure 11:
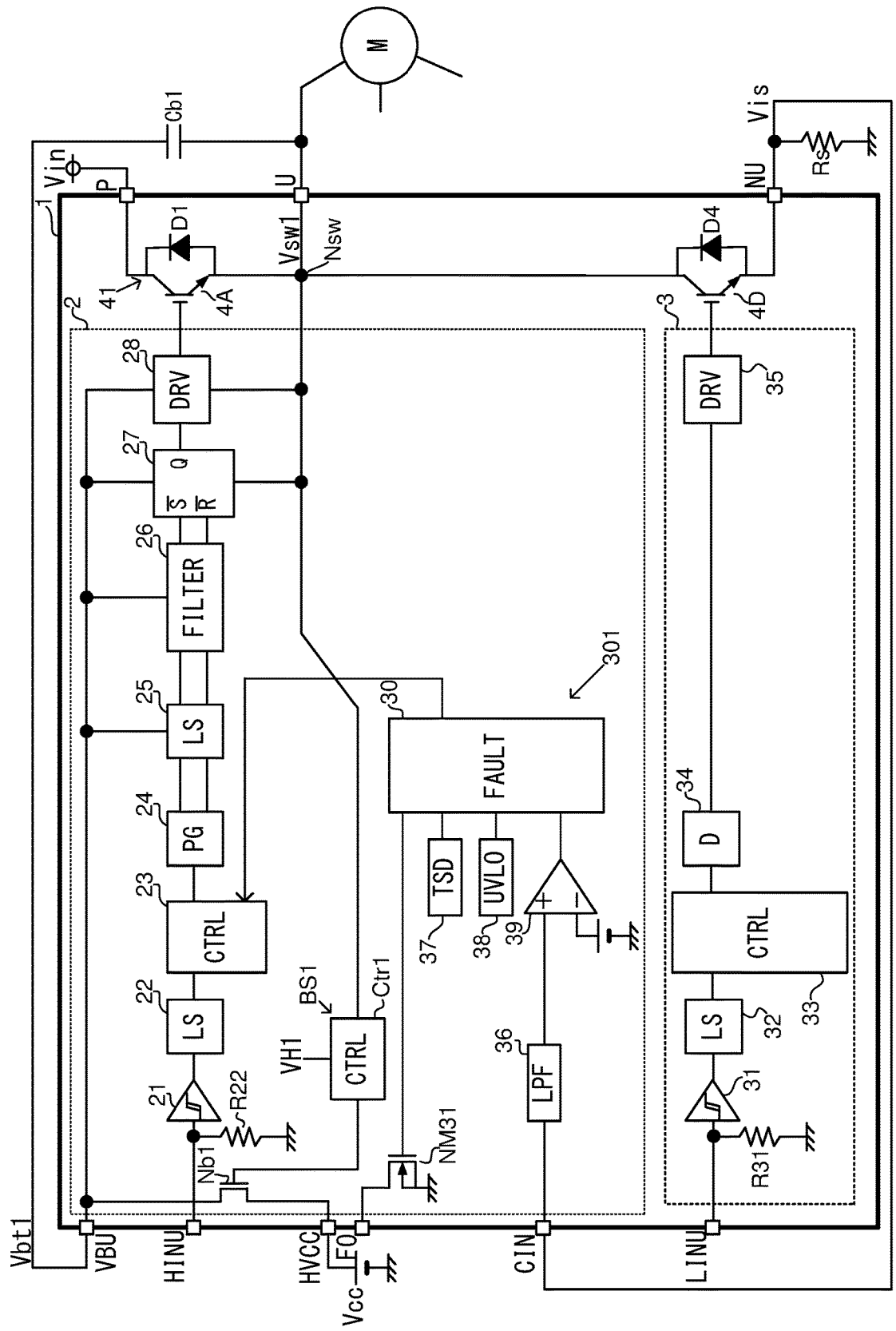
FIG. 11 is a configuration diagram showing a modified example of the IPM shown in FIG. 3.

It is also possible to modify the configuration shown in FIG. 3 described above into, for example, a configuration like the one shown in FIG. 11. In the configuration shown in FIG. 11, the fault protector 301 (the fault signal generation circuit 30, the low-pass filter 36, the TSD circuit 37, the UVLO circuit 38, and the overcurrent protection circuit 39) and the NMOS transistor NM31 shown in FIG. 3 are provided in the high-side driver IC 2 instead of in in the low-side driver IC 3.

INDUSTRIAL APPLICABILITY

The present invention finds applications, for example, as means for driving DC brushless motors.

LIST OF REFERENCE SIGNS

1 IPM
2 high-side driver IC
3 low-side driver IC
41 first switching arm
42 second switching arm
43 third switching arm
4A first high-side transistor
4B second high-side transistor
4C third high-side transistor
4D first low-side transistor
4E second low-side transistor
4F third low-side transistor
5A to 5F, 6 photocoupler
7 MCU
10 printed circuit board
15 IPM system
21 Schmitt trigger
22 level shifter
23 controller
24 pulse generator
25 level shifter
26 filter
27 RS flip-flop
28 driver
281 first driver
282 second driver
283 third driver
30 fault signal generation circuit
31 Schmitt trigger
32 level shifter
33 controller
34 delay circuit 35 driver
36 low-pass filter
37 TSD circuit
38 UVLO circuit
39 overcurrent protection circuit
301 fault protector
51 first voltage adjuster
52 second voltage adjuster
53 third voltage adjuster
531 voltage division resistor
532 voltage division resistor
533 buffer
534 constant current circuit
535 Zener diode
536 buffer
54 fourth voltage adjuster
55 fifth voltage adjuster
56 sixth voltage adjuster
D1 to D6 antiparallel diode
Cb1 first boot capacitor
Cb2 second boot capacitor
Cb3 third boot capacitor
Nb1 first NMOS transistor
Nb2 second NMOS transistor
Nb3 third NMOS transistor
Ctr1 first controller
Ctr2 second controller
Ctr3 third controller
BS1 first bootstrap circuit
BS2 second bootstrap circuit
BS3 third bootstrap circuit
M motor
R21, R31, Rs resistor
NM31 NMOS transistor

The invention claimed is:

1. A semiconductor device comprising:
a plurality of high-side transistors and a plurality of low-side transistors connected in series between an input voltage and a ground potential to form a plurality of switching arms;
a plurality of NMOS transistors respectively having
drains configured to be connectable to respective second terminals of a plurality of boot capacitors of which respective first terminals are connectable to respective nodes at which the plurality of high-side transistors and the plurality of the low-side transistors are connected together, and
sources configured to be electrically connectable to an application terminal for a supply voltage;
a plurality of controllers configured to drive respective gates of the plurality of NMOS transistors;
a plurality of drivers configured to feed respective boot voltages appearing at the respective second terminals or respective switching voltage appearing at the respective nodes to respective control terminals of the plurality of high-side transistors to turn on and off the high-side transistors,
wherein
when the high-side transistor for a first channel is kept off by the driver for the first channel, the high-side transistor for a second channel, which is different from the first channel, is kept on by the driver for the second channel, and
the controller for the first channel feeds a drive voltage based on the boot voltage for the second channel to a gate of the NMOS transistor for the first channel to keep on the NMOS transistor; and
a voltage adjuster configured to adjust the boot voltage for the second channel to make the boot voltage equal to the drive voltage lower than the boot voltage.

2. The semiconductor device according to claim 1, wherein the controller for the first channel is configured to turn on the NMOS transistor upon detecting that, while the low-side transistor for the first channel is off, the high-side transistor for the first channel is turned off and then the low-side transistor for the first channel is turned on.

3. The semiconductor device according to claim 2, wherein the controller for the first channel is configured to turn on the NMOS transistor upon detecting that the switching voltage for the first channel drops to a voltage lower than the ground potential and then becomes equal to the ground potential.

4. The semiconductor device according to claim 1, wherein the controller for the first channel is configured to turn on the NMOS transistor upon detecting that, while the low-side transistor for the first channel is off, the high-side transistor for the first channel is turned off.

5. The semiconductor device according to claim 4, wherein the controller for the first channel is configured to turn on the NMOS transistor upon detecting that the switching voltage for the first channel becomes lower than the ground potential.

6. The semiconductor device according to claim 1, wherein the voltage adjuster includes
a voltage division resistor configured to divide the boot voltage, and
a buffer configured to be fed with a voltage divided with the voltage division resistor to output the drive voltage.

7. The semiconductor device according to claim 1, wherein the voltage adjuster includes
a constant current source configured to generate a constant current based on the boot voltage, and
a Zener diode configured to be fed with a current generated by the constant current source.

8. The semiconductor device according to claim 1, wherein
the plurality of high-side transistors comprise three high-side transistors,
the plurality of low-side transistors comprise three low-side transistors,
the plurality of switching arms comprise three switching arms,
the plurality of boot capacitors comprise three boot capacitors,
the plurality of NMOS transistors comprise three NMOS transistors,
the plurality of controllers comprise three controllers, and
the plurality of drivers comprise three drivers.

9. The semiconductor device according to claim 8, wherein the plurality of high-side transistors are turned on and off with a 120 degree phase difference from each other.

10. The semiconductor device according to claim 8, wherein the respective nodes are connectable to a U-phase terminal, a V-phase terminal, and a W-phase terminal of a DC brushless motor.

11. The semiconductor device according to claim 1, wherein the high-side and low-side transistors are turned on and off based on a driving control signal output from a microprocessor arranged outside the semiconductor device.

* * * * *